United States Patent
Beakes et al.

[11] Patent Number: 6,005,416
[45] Date of Patent: Dec. 21, 1999

[54] COMPILED SELF-RESETTING CMOS LOGIC ARRAY MACROS

[75] Inventors: Michael Patrick Beakes, Yorktown Heights, N.Y.; Barbara Alana Chappell; Terry Ivan Chappell, both of Portland, Oreg.; Gary S. Ditlow, Garrison, N.Y.; Barry Lee Dorfman, Austin, Tex.; Bruce Martin Fleischer, Mount Kisco; Vinod Narayanan, Fishkill, both of N.Y.; David James Widiger, Pflugerville, Tex.

[73] Assignee: International Business Machines Corporation, Armonk, N.Y.

[21] Appl. No.: 08/850,190

[22] Filed: May 2, 1997

[51] Int. Cl.$^6$ .................................................. H03K 19/096
[52] U.S. Cl. .............................. 326/96; 326/97; 326/121
[58] Field of Search ................................ 326/93–98, 121

[56] References Cited

U.S. PATENT DOCUMENTS

| | | | |
|---|---|---|---|
| 5,550,490 | 8/1996 | Durham et al. | 326/98 |
| 5,565,798 | 10/1996 | Durham et al. | 326/93 |
| 5,828,234 | 10/1998 | Sprague | 326/97 |
| 5,870,411 | 2/1999 | Durham et al. | 326/93 |

*Primary Examiner*—Jon Santamauro
*Attorney, Agent, or Firm*—F. Chau & Associates, LLP

[57] ABSTRACT

A logic circuit family implements self-resetting CMOS logic array macros (SLAMs) which include a plurality of inputs to which a plurality of data input signals can be applied; a plurality of input buffers coupled to receive the input signals from the inputs; a NOR circuit coupled to receive the outputs of the input buffers and a pulsed logic timing signal synchronized within a predefined window with the arrival of the data input signals; an output buffer coupled to receive the output of the NOR circuit; and an output at which a data output signal is produced, with the output signal being a logical NOR of the data input signals; and with each of the NOR circuit, the plurality of input buffers, and the output buffer optionally having a separate reset input to reset it to a standby state. The SLAMs address the very high pressure on the performance of both control logic and control logic design systems. The distinguishing features of SLAMs are uniquely combined to allow the automated design, from a logic description and interface specifications, of a complete macro satisfying predetermined design guidelines.

38 Claims, 8 Drawing Sheets

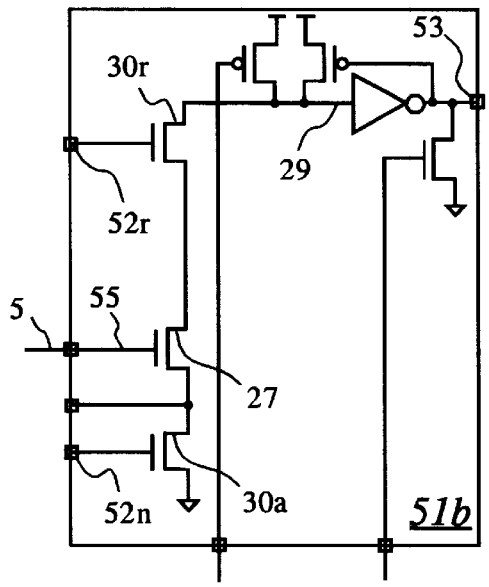
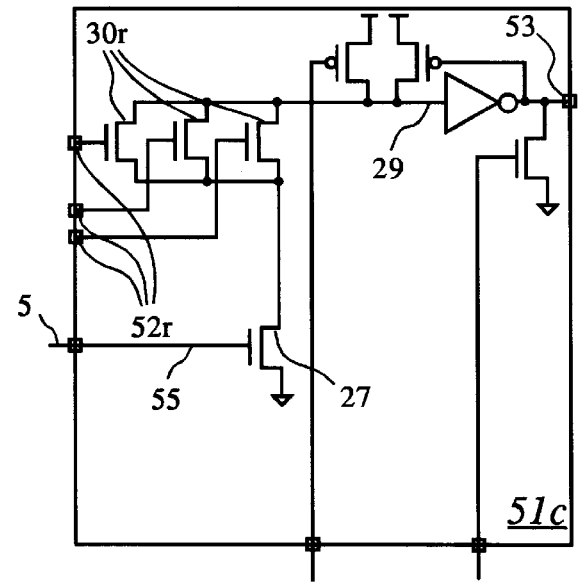
FIG. 8A        FIG. 8B
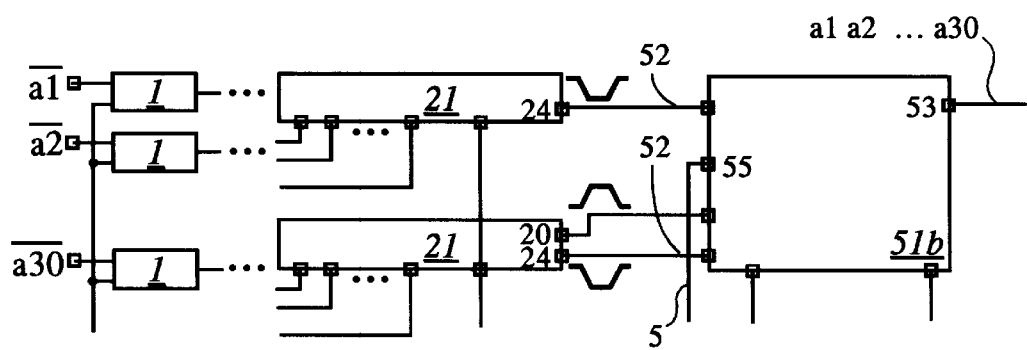
FIG. 9

FIG. 14B
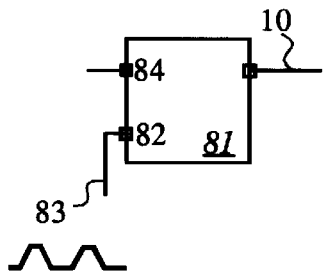
FIG. 14A
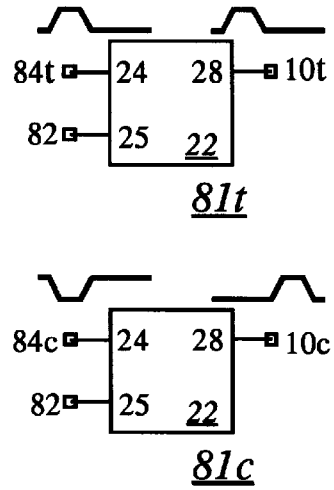
FIG. 14C
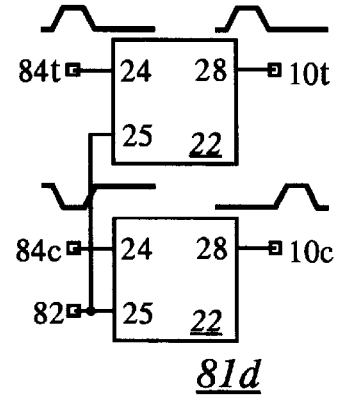
FIG. 14D
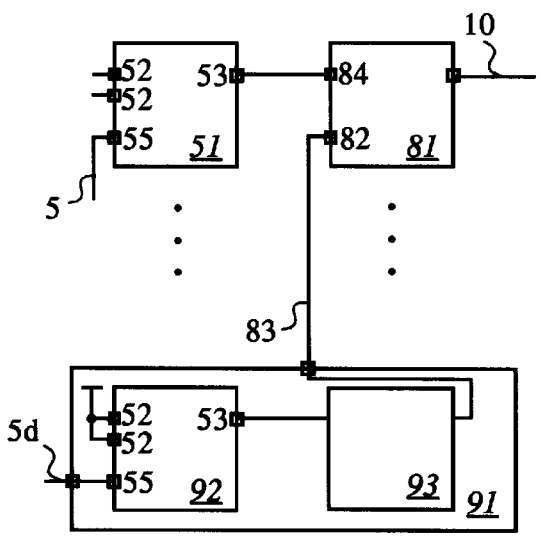
FIG. 15

COMPILED SELF-RESETTING CMOS LOGIC ARRAY MACROS

BACKGROUND INFORMATION

1. Technical Field

This disclosure relates generally to logic circuits, and more particularly to a logic circuit family implementing self-resetting CMOS logic array macros for control logic.

2. Description of the Related Art

In fabricating microprocessor circuits, nearly all of the circuitry in current-generation microprocessors may be divided into dataflow devices, including execution units and their components, such as adders; into caches; and into control logic.

In particular, dataflow elements and caches share a number of characteristics:

1) Their logical descriptions are usually compact, with a ratio of logic statements to total transistors typically being under about 1:10,000 for an adder.
2) Their regular logical structure allows repeated use of physical structures, which keeps the ratio of designed transistors to total transistors to a low value.
3) The number of macros is limited; i.e. there are typically a few dozen macros with a size being of the same order of magnitude as a fixed-point unit adder.
4) Dataflow and cache logical descriptions are established and fixed early in the project.

Because of these features, it is possible to hand-craft custom designs for dataflow and cache macros which are highly optimized at the level of individual transistors.

Control logic, on the other hand, generally has a much larger logical description which is typically random in nature, and is subject to revision by designers until the last possible moment in the schedule of the project. Control logic, therefore, requires a mostly automated design system with a rapid turn-around to provide a completely verified design for an individual macro, for example, in a matter of hours. At the same time, and partly due to the limitations of available automated design systems, control logic is an important limiting factor in the performance of processors heretofore known in the art, in which performance is measured, for example, by the multiplicative product of the clock frequency and the number of functions per clock cycle.

If one were to design a custom complementary metal oxide semiconductor (CMOS) circuit to perform a given function at high speed and at a reasonable cost in area and power, the following examples of general guidelines are to be adhered to:

1) Minimize the number of delay stages and parasitic loading on critical paths.
2) Tune transistor widths to match their loads and required noise margins.
3) Limit the number of global nodes in uncontrolled noise environments, requiring higher noise margins.
4) Establish for local nodes a controlled low-noise environment, allowing lower noise margins.
5) Use the best circuit techniques known, appropriate to the noise environment at each stage.

Heretofore, control circuits have not been implementable by sufficiently rapid automated design techniques, and so any relatively quick turn-around has often resulted in excessive parasitics as well as noise figures exceeding specified noise margins.

SUMMARY

It is recognized herein that circuits implemented as self-resetting CMOS logic array macros (SLAMs) allow for rapid automated design, from a logic description and interface specifications, of a complete macro satisfying the above guidelines to minimize parasitics and to meet required noise margins.

A logic circuit family is disclosed for implementing SLAMs which includes a plurality of inputs to which a plurality of data input signals may be applied; a plurality of input buffers coupled to receive the input signals from the inputs; a NOR circuit coupled to receive the outputs of the input buffers and a pulsed logic timing signal synchronized within a predefined window with the arrival of the data input signals; an output buffer coupled to receive the output of the NOR circuit; and an output at which a data output signal is produced, with the output signal being a logical NOR of the data input signals; and with each of the NOR circuit, the plurality of input buffers, and the output buffer optionally having a separate reset input to reset it to a standby state.

The logic circuits of the disclosed circuit family, referred herein as SLAMs, address the very high pressure on the performance of both control logic and control logic design systems. The distinguishing features of SLAMs are uniquely combined to allow the automated design, from a logic description and interface specifications, of a complete macro satisfying the above guidelines.

Input and output buffers, array floorplanning, and signal and power wiring schemes all contribute to well-controlled physical and electrical environments within a SLAM, minimizing parasitics and required noise margins. SLAMs use a form of unidirectional switching logic called self-resetting CMOS (SR-CMOS or SRCMOS) which, in this controlled environment, may provide simultaneously high gain and functionality. SRCMOS is similar to other families of unidirectional switching circuits, such as domino CMOS. However, unlike static CMOS, SRCMOS avoids loading inputs and outputs with the parasitics of dual device trees. SRCMOS in particular requires no global timing signals between latches. In addition, external trigger inputs come from data or timing outputs of source macros, and resets are generated internally. By using locally-generated timing signals, SRCMOS circuits may offer fast and wide ANDs as well as ORs, and phase inversion at many stages. SLAMs take advantage of this functional richness to implement high-function critical paths in few delay stages.

The regular, well-structured physical image used in SLAMs supports automated physical compilation by tiling atomic building blocks. This structure also enhances modeling accuracy, by keeping wire parasitics small and predictable and controlling metal usage to minimize internal RC delays. With this modeling accuracy, device widths at each stage are automatically tuned to their loads over a wide range of sizes, leading to uniformly fast switching speeds and timing correctness of automatically sized circuits to generate reset and timing signals. In addition, the particularly used circuit techniques result in stage delays which have little skew or pattern dependence and no history dependence, allowing for top-down tuning and partitioning of large designs.

BRIEF DESCRIPTION OF THE DRAWINGS

The features of the disclosed logic circuits will become more readily apparent and may be better understood by referring to the following detailed description of illustrative embodiments of the present invention, taken in conjunction with the accompanying drawings, in which:

FIGS. 8A-8B are schematic drawings of further examples of strobed logic gates, with AND and OR logic functions;

FIG. 9 is a schematic drawing of an implementation of a wide AND function, such as a 30-way AND function;

FIG. 13 is a schematic drawing of a two-stage pulsed OR gate with greater fan-in;

FIGS. 14A–14D are schematic drawings of the structures of various embodiments of strobed output buffers;

FIG. 15 is a schematic drawing of the structure of an output timing signal generator for use with strobed output buffers.

DESCRIPTION OF THE PREFERRED EMBODIMENTS

Figure 1:
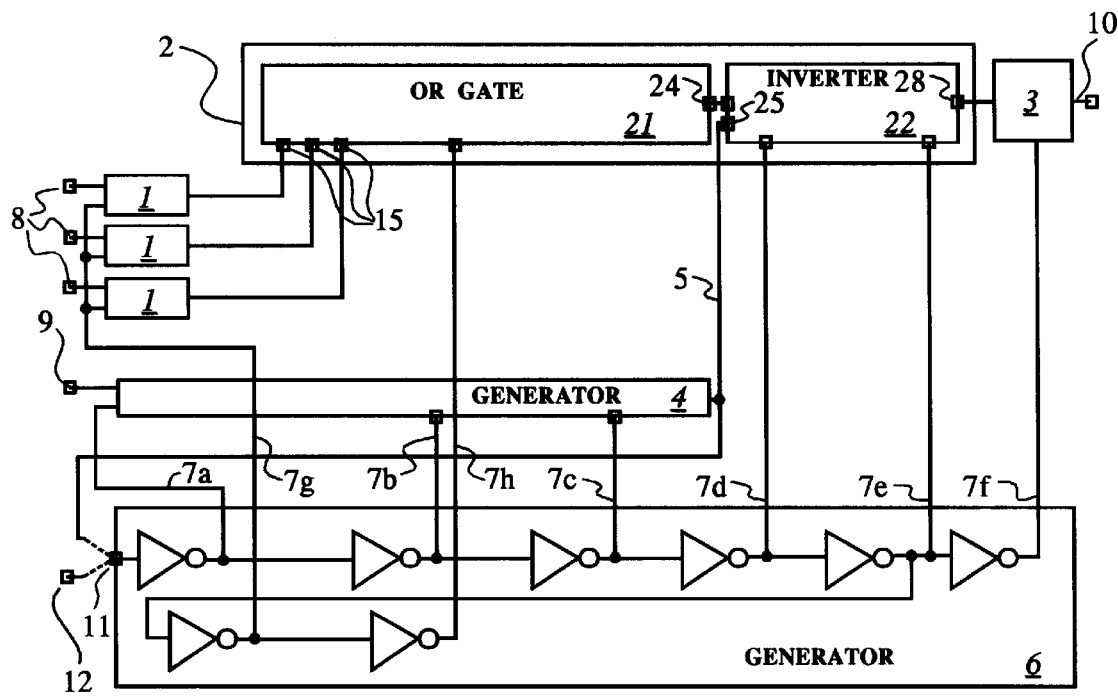
FIG. 1 is a schematic drawing of a SLAM with one logic output, which represents the logical NOR of the logic inputs of the SLAM.

Referring now in specific detail to the drawings, with like reference numerals identifying similar or identical elements, as shown in FIG. 1, an illustrative embodiment of a SLAM is provided for implementing a strobed-NOR SLAM. SLAMs may be used to implement arbitrary logic functions, having many inputs and outputs, within the physical limits of the technology used.

The circuitry and array images which provides the features of the SLAM of FIG. 1 are described in the following sections of this disclosure. Compilable bit-slice circuits such as registers, multiplexers, and comparator banks with circuitry which are related to and which may be compatible with SLAMs are described in a commonly assigned U.S. patent application Ser. No. 08/850,193 entitled "A METHOD AND APPARATUS FOR GENERATING BIT-SLICE MACROS", which is filed concurrently herewith and which is incorporated herein by reference.

Such bit-slice macros, together with the random-logic SLAMs disclosed herein, may be considered members of the SLAM family of compilable circuits. Such SLAMs and related circuits may be implemented using software systems for automated construction of SLAM-family macros and semi-automated systems for optimizing global timing and interfaces in networks of connected SLAMs, as described in a commonly assigned U.S. patent application Ser. No. 08/850,037 entitled "A METHOD AND APPARATUS FOR SYNTHESIZING AND OPTIMIZING CONTROL LOGIC BASED ON SRCMOS LOGIC ARRAY MACROS", which is filed concurrently herewith and which is incorporated herein by reference.

In the illustrative embodiment shown in FIG. 1, the SLAM incorporates the most basic SLAM characteristics, which may be configured and/or extended in alternative embodiments, as described below, to provide different features and more functionality.

As shown in the logic diagram in FIG. 1, a SLAM macro implements a single self-timed strobed NOR gate, including input buffers 1, a core strobed NOR circuit 2, an output buffer 3, a generator 4 for a logic timing signal 5, and a generator 6 for the reset signals 7a–7h. The SLAM has logic inputs 8 and a timing input 9, and one logic output 10.

The input buffers 1 serve several functions. For example, the input buffers 1 provide gain to keep input capacitance relatively low even in very large SLAM implementations. Multiple-stage input buffers may provide greater gain, if desired. Besides reducing input capacitance, the use of input buffers provides an independent capacitance for the patterning and timing of other inputs for better global modeling. The input buffers 1 also provide noise isolation between the uncontrolled and potentially very noisy environment of globally-routed signals outside the SLAM and the more sensitive, high-speed gates inside the SLAM. The input buffers are to be designed for maximum input noise margin. For example, when used for implementations with static inputs, the input buffers 1 may have, for example, a threshold of about VDD/2.

Generally, buffers for pulsed inputs are to be implemented using a conservative design point with regard to speed and input threshold. The input buffers 1 are to be tuned to the load presented by the internal logic of the SLAM, so that the delays and transition times of all the input buffers 1 are about the same and equal to predetermined target times. Such timing improves the implementation of the sizing and tuning of later stages. Such tuning may be implemented as described, for example, in the commonly assigned U.S. patent application Ser. No. 08/850,037 entitled "A METHOD AND APPARATUS FOR SYNTHESIZING AND OPTIMIZING CONTROL LOGIC BASED ON SRC-MOS LOGIC ARRAY MACROS", which is filed concurrently herewith and which is incorporated herein by reference.

Such SRCMOS-based circuits are also described, for example, in T. I. Chappell et al., "A 2-ns Cycle, 3.8-ns access 512-kb CMOS ECL SRAM With a Fully Pipelined Architecture", IEEE JOURNAL OF SOLID STATE CIRCUITS, VOL. 26, NO. 11, November 1991, pp. 1577–1585; as well as in U.S. Pat. No. 4,845,577, which is incorporated herein by reference.

Figure 2A:
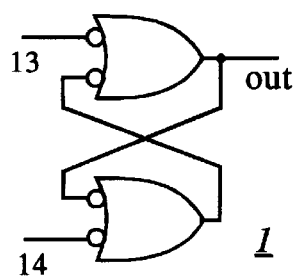
FIG. 2A is a schematic drawing of a set-reset latch used to buffer the logic inputs of the SLAM.
Figure 2B:
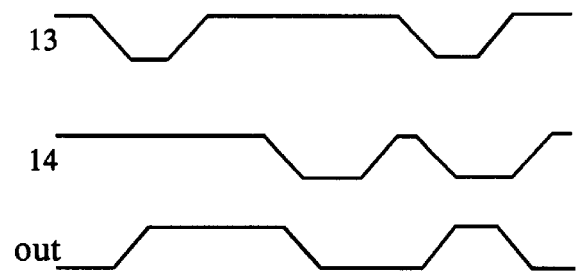
FIG. 2B is a timing diagram of the set-reset latch of FIG. 2A.

When receiving pulsed inputs, set-reset latches may serve satisfactorily as input buffers 1. A logic diagram of an illustrative set-reset latch is shown in FIG. 2A, which is set by an active-low pulse at its data input 13, and reset by an active-low pulse on a reset signal 14 common to all input buffers, as shown in the illustrative waveforms in FIG. 2B. Each input buffer may accept an early pulse at its data input 13 and hold it until the rest of the SLAM is triggered. Its minimum hold time is determined only by the pulse width needed to set the latch, and has no interaction with other signals. Overlap of input 13 and reset 14 pulses does not cause collisions or excessive supply current, as described in V. Narayanan et al., "Static Timing Analysis for Self-Resetting Circuits", PROCEEDINGS OF ICCAD, November 1996. If there is overlap, however, the reset pulse 14 must last longer in order to reset the latch.

In the illustrative embodiment shown in FIG. 1, the strobed NOR 2 includes a pulsed OR circuit 21 followed by a strobed inverter 22. In this embodiment, the pulsed OR circuit 21 is a dynamic CMOS OR gate, with parallel NFET pulldown devices 23 which discharge the OR node 24 when triggered by active-high pulses at the OR inputs 15, and "babysitting" circuitry 16 which includes a reset device 17 and a half-latch to maintain a steady standby level. The half-latch includes a dedicated inverter 19 and a "keeper" device 18. The use of a dedicated half-latch for the OR circuit 21, allows the function of the half-latch to control the noise margin to be optimized independently of the device sizing and logic function of later stages.

In addition, the presence of a dedicated inverter 19 in the half-latch frees downstream logic from having to produce and feed back an active-high copy of the OR node 24. In fact, the active-high output 20 of the inverter 19 is used, in some cases, as an active-high output 20 of the OR circuit 21 by later logic. The physical layout of the OR circuit 21 approximately matches the linear arrangement of the components in FIG. 1. This linear arrangement allows for a compact layout with low parasitic capacitance on the OR node 24, and easy construction of arrays by stacking similar rows.

One might be tempted to call the OR circuit 21 a NOR by itself, thinking in terms of voltage levels, but pulses matter more than levels in the terminology of pulsed logic. The circuit 21 is referred to herein as an OR gate with an active-low output 24, since a pulse appears at the output 24 whenever a pulse appears at any of the inputs 15.

Figure 3:
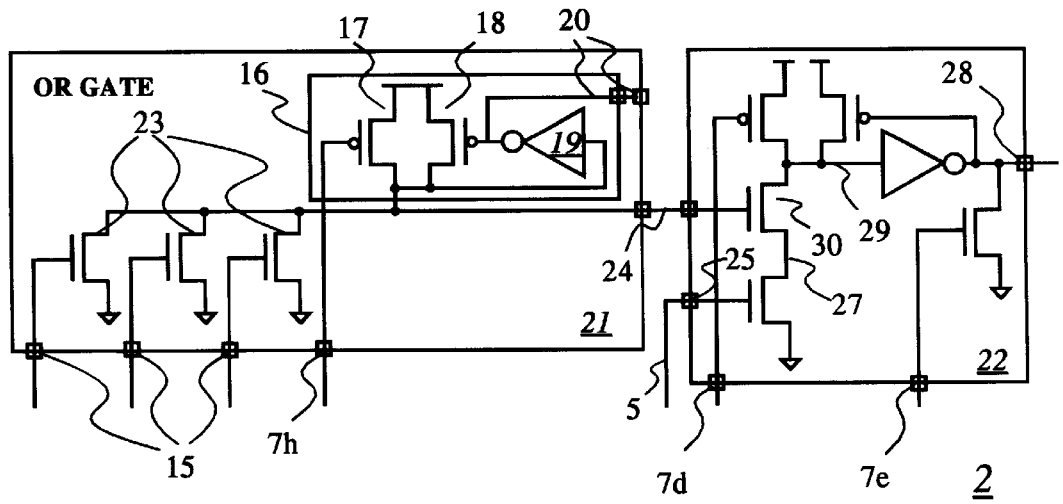
FIG. 3 is a schematic drawing of the detailed structure of a pulsed NOR gate.

The strobed inverter 22 in FIG. 1 and FIG. 3 acts as an AND circuit in terms of pulses, if it had two active-high pulsed data inputs, since both inputs must be high to trigger it. As used, however, its inputs are the active-low OR node 24 and an active-high logic timing signal 5 which pulses every cycle, synchronized with the action of the OR circuit 21. This synchronization is used for the correct operation of the SLAM, as described in more detail below, together with other features of the logic timing signal 5 and reset signals 7a–h. As described herein, the OR node 24 is valid during the pulse on the logic timing signal 5. That is, if there is a pulse on the OR 24, it begins before and ends after the timing signal 5. As a result of this timing, the circuit 22 functions as an inverter for pulsed logic.

If the OR node 24 corresponds to a logic 0, i.e. corresponding to no pulse=standby=high, the intermediate node 27 and output 28 of the inverter 22 are triggered, i.e. is a logic 1 signal, when the logic timing signal 5 arrives. If the OR node 24 receives a logic 1 pulse signal with the given timing, the OR node 23 is active low during the logic timing signal 5, and the intermediate node 27 and output 28 remains in standby with a logic 0 level.

The position of the logical inversion described above, immediately following the OR circuit, is one of three places in which SLAMs may provide inversions. The other two places are at the inputs and outputs of the SLAM as a whole. The ability to invert inputs and outputs gives SLAMs logical flexibility similar to inverting static circuits, together with the speed of non-inverting dynamic circuits. The flexibility to accept either logical phase of an input, or to provide true and/or complement outputs, means that neighboring logic macros may be simplified and that dual logic paths are not needed. It also means that the input inversions needed to implement a wide AND with the wide NOR of the SLAM may take place in the SLAM if the required input phases are not available.

The Logic Timing Signal

As mentioned above, the logical inversion 22 following the OR circuit 21 requires a logic timing signal 5. Any inversion in pulsed logic requires a timing signal or "strobe" in addition to the data input, to trigger an output pulse when the data input has no pulse. Correct operation of such an inverter puts specific requirements on input timing. Generally, the data input must be valid when the timing signal is active; i.e. if the data input has a pulse, it must begin by falling before the strobe pulse begins by rising, and it must end after the strobe ends. This timing insures that, when the data input is active, and the output is supposed to stay quiet, the data and strobe inputs are never high at the same time.

Figure 4:
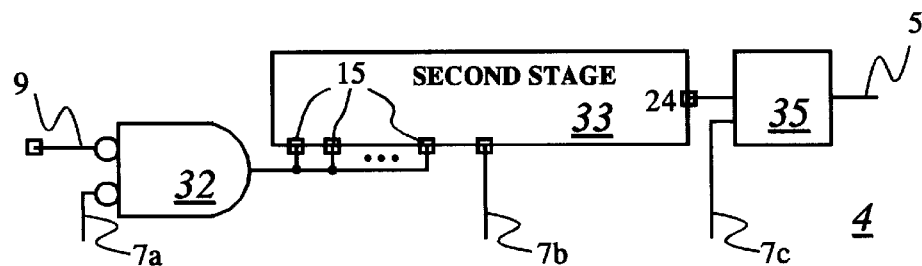
FIG. 4 is a schematic drawing of the detailed structure of a timing signal generator of the SLAM.

As shown in FIG. 4, a three-stage circuit 4 is shown to generate the logic timing signal 5. The circuit 4 is triggered by a pulsed input 9 to the SLAM which is active every cycle; i.e. it carries no logic, only timing information. The first stage 32 in the timing signal generator 4 is a buffer which is tuned to a predetermined target delay approximately equal to that of the buffers 1 for the data inputs 8.

The second stage 33 is a buffer implemented as a multi-input dynamic OR gate with all the inputs tied together. The OR gate 33 should have the same construction as the OR circuit 21, or alternatively differing only in the number of inputs. In the illustrative embodiment, the OR gate 33 uses NFET pulldown devices 34 with the same dimensions and layout as the NFETs 23 in the OR circuit 21. The number of parallel devices 34 in the OR gate 33, and their total channel width, is chosen based on the desired delay of the stage with the OR stage 33 and the load presented by the next stage 35. The OR gate 33 typically should be physically located adjacent to the OR circuit 21 and should share the same power-supply wiring. Given the above conditions, the delays of the OR circuits 21 and 33 track each other through variations in process and operating conditions. Note that the delays are not the same, since the delay of the OR circuit 21 increases with the number of inputs. The final stage of the timing signal generator 4 is a buffer 35 sized to drive the wire and gate load of the timing signal 5.

The path from the SLAM timing input 9 to the timing signal 5 is three stages, and from the SLAM logic inputs 8 to the OR signal 24 is two stages. Therefore, if the data inputs 8 arrive no later than the timing input 9, and given a uniform delay per stage, the leading edge of the OR signal 24 precedes the leading edge of the timing signal 5 by about one stage delay. As part of the design process, the strobed inverter 22 must be simulated in detail to see how late the OR signal 24 may fall, relative to the timing signal 5, and still prevent the NOR output 28 from being triggered. After the timing signal 5 rises, some time is required for the intermediate node 27 in the strobed inverter 22 to fall, and a minimum gate-source voltage is needed on the data input device 30 to pull down the tree node 29. In practice, therefore, the OR signal 24 may fall about one stage delay after the timing signal 5 rises, without the NOR output 28 pulsing.

If all stages have the same delay, and the SLAM data inputs 8 have a non-negative setup time relative to the timing input 9, the timing margin at the SLAM inputs 8 is about two stage delays. As mentioned above, however, the OR circuit 21 may be slow if it has a high fan-in. For example, with twelve inputs and only one active input, the OR circuit 21 is about one stage delay slower than the OR gate 33 in the timing signal generator. The SLAM data inputs 8 could still have a required minimum setup time of zero relative to the SLAM timing input 9, with a one-stage-delay timing margin at the strobed inverter 22.

The timing margin may be increased by tuning the stages 32,33,35 of the timing signal generator 4 to slower target times, or by adding stages, thus delaying the strobe 5 to the inverter 21. The latency through the SLAM is increased, however, by exactly the amount of added margin. One may also vary the margin by changing the allowed maximum fan-in of the OR logic 21, in which case increased margin is obtained at the expense of decreased functionality.

In the case in which one of the pulsed data inputs 8 to the SLAM is available in both true and complement phases, one of the two phases is guaranteed to pulse every cycle. This input may provide timing information instead of using a separate timing input 9, for example, using the selection of a timing input and the impact of such a selection on the timing analysis, as described in the commonly assigned U.S. patent application entitled "A METHOD AND APPARATUS FOR SYNTHESIZING AND OPTIMIZING CONTROL LOGIC BASED ON SRCMOS LOGIC ARRAY MACROS", which is filed concurrently herewith and which is incorporated herein by reference.

Figure 5:
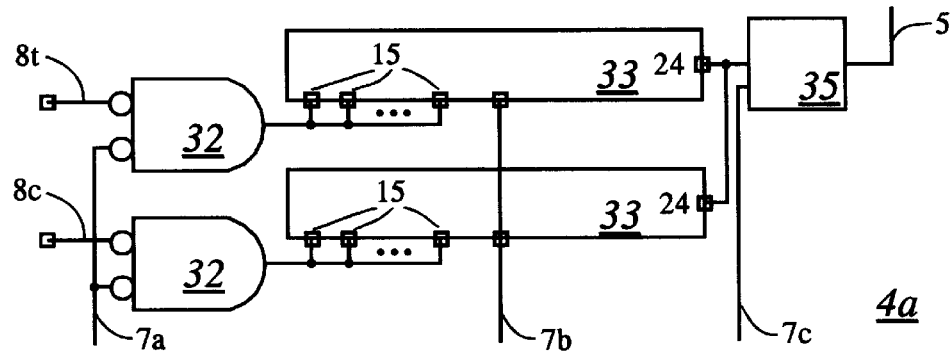
FIG. 5 is a schematic drawing of the detailed structure of a timing signal generator triggered by true and complement inputs.

The logic diagram in FIG. 5 shows an embodiment of a timing signal generator 31 with a true/complement trigger 9a,b. The middle stage 36 of the timing signal generator 31 is logically a two-input pulsed OR gate to combine the true and complement input phases 9a,b. The two branches of the OR gate 36 are each implemented in the same way as the OR gate 33, with the outputs 37 of the two branches 33 wired together. As in the timing signal generator 4, the individual devices 34 have the same dimensions as those in the logic OR gate 21, in which the number of devices 34 is chosen to tune the delay of the OR gate 36 to the desired value.

Reset Signal Generator

Each of the pulsed logic blocks in FIG. 1 is returned to its standby state by one of the input reset signals 7a–h. FIG. 1 includes the logical structure of the reset signal generator 6, which generates the reset signals 7a–h. This reset signal generator 6 meets the timing requirements for the logic blocks by choosing outputs from a delay chain 36a–h to reset the blocks in the correct order. Reset timing requirements fall into two categories. First, as with all pulsed circuits, pulse collisions between resets and inputs are to be avoided. For example, the logic OR gate 21 should not be reset by reset signal 7h while any of its inputs 15 are still on, so the reset signal 7h for the OR gate 21 should be later than the reset signal 7g for the input buffers 1. Second, the strobed inverter 22 must remain in standby throughout those cycles in which its output 28 is to be logically false; the reset signal 7h for the OR node 24 should be later than the reset signal 7d for the logic timing signal 5, as well.

As shown, the stages of the timing signal generator 4 are reset in order, from the input buffer 32 to the timing signal 5, by reset signals 7a–7c. With the timing signal 5 off, the strobed inverter 22 may be reset by reset signals 7d-e without concern for the level of the OR signal 24. Finally, the input buffers 1 are reset by reset signal 7g, followed by the OR gate 21 by reset signal 7h.

The late reset of the input buffers 1 and the OR gate 21 achieves several aims. The allowed maximum pulse width at the data inputs 8 is set by this timing, because the data input pulses 13 to the set-dominant input buffers 1 must end sufficiently before the end of the reset pulses 14 to allow the buffers 1 to be reset. As the buffers 1 are reset later, the allowed input pulses 13 widens. Since no other internal signals are waiting for the OR gates 21 to be reset, very wide input pulses 13 may be accommodated by a late reset signals 7g,h of the buffers 1 and OR gate 21, with the only impact being an eventual increase in cycle time. Also, the late reset signal 7h of the OR gate 21 helps maintain a comfortable margin of several gate delays between the timing signal 5 returning low and the OR signal 24 returning high.

With the timing described in the previous paragraphs, the logic timing signal 5 performs several important functions. First, its leading edge is used to sample the voltage level of the OR signal 24, allowing for the logical inversion of the OR circuit 21 and for implementation of a wide AND function. Second, its trailing edge isolates the strobed inverter 22 and following circuits from the input buffers 1. The reset signal 7c of the logic timing signal 5 sets the pulse-width at the NOR output 28, while the independent reset signal 7g of the input buffers 1 sets the allowed input pulse-width.

In self-timed dynamic circuits, the pulse width tends to grow from stage to stage, as demand for high speed leads to faster propagation of leading edges than trailing edges. An early reset signal 7c of the timing signal 5 helps avoid overly-wide pulses in later stages of SLAMs. To allow this early reset without undue restrictions on the pulse width of the timing inputs 9, 8a-8b, the input buffers 32 for timing inputs are gated by their input reset signal 7a. The static NOR gates shown in the illustrative embodiment have poorer gain-delay tradeoffs than the S-R latches used for data inputs, which is satisfactory. The timing inputs 8a-8b and 9 are relatively few in number, with the multi-stage timing path 4 usually having significant gain, and with the timing path 4 being slowed down, for example, to maintain timing margin for the data inputs 1.

The trigger 11 for the reset signal generator 6 may be the logic timing signal 5, in which case the SLAM is self-resetting, with its activity being triggered by the leading edges of its data inputs 1, and with a reset to a standby state in a fixed time, regardless of how long the actual cycle time is. On the other hand, the trigger 11 may be an external reset input 12, and the pulsewidths of the signals of the SLAM, including its outputs, are then set by that external input 12. Using a clock phase for the reset input 12 makes the timing of the SLAM consistent with timing schemes for domino logic, as described in Weste et al., PRINCIPLES OF CMOS VLSI DESIGN, 2nd Edition, Addison-Wesley, 1992, pp. 308–310; as long as the setup-time requirements of the SLAM are met.

More Powerful Logic

The SLAM embodiment described above implements a single strobed NOR gate. Given the freedom to choose the phase of the input signals of the SLAM, this gate may be used as a fast, wide AND gate. Within the scope of this embodiment, the function of the strobed inverter 22, timing signal 5, and reset signals 7a–h performs as described above. However, macros are typically implemented with more than one AND gate, which may require implementation of SLAM embodiments with more powerful logic, including optional phase inversion of individual data inputs, a strobed AND-OR gate instead of the strobed inverter, multiple strobed gates, a second OR array, multiple outputs, and output inversion, as described below.

Strobed-OR

Figure 6:
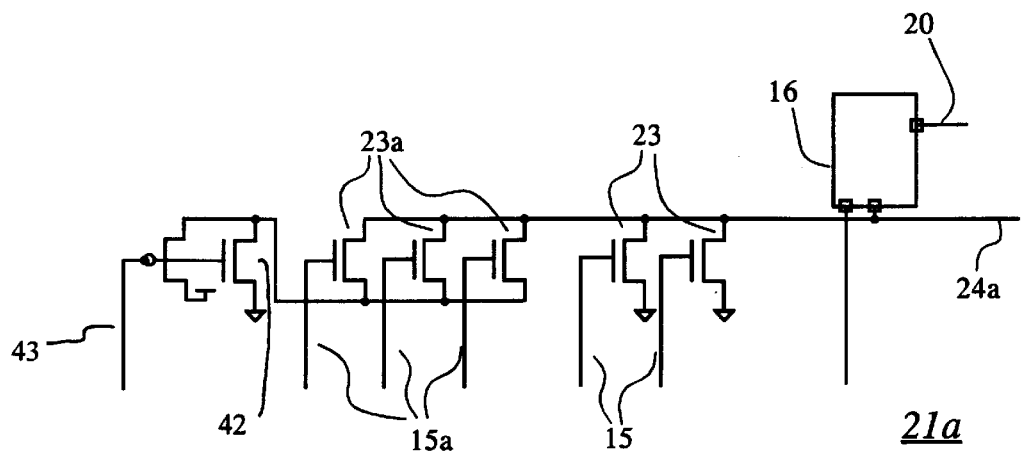
FIG. 6 is a schematic drawing of the detailed structure of a strobed OR gate.

The logic diagram in FIG. 6 shows an embodiment of a strobed OR gate 21a. It is similar to the OR gate 21 in FIG.

1, with the addition of an input sampling device 42 under some branches 23a of the strobed OR circuit 21a. Some timing conditions must be met for this gate 21a to work correctly; i.e. the input timing signal 43 which drives the input sampling device 42 must have an active-high pulse every cycle, and the sampled inputs 15a must be valid during the pulse on the input timing signal 43. The OR circuit 21a responds with an active-low pulse on the OR node 24a when an active-high pulse is present on any of the non-sampled inputs 15 or if one of the sampled inputs 15a is high during the pulse on the input timing signal 43.

If a sampled input 15a is an active-high pulsed signal 15b, the signal 15b is ORed with the others, and may alternatively be connected to an unsampled input 15. If a sampled input 15a is an active-low pulsed signal which is valid during the input timing pulse 15c, the complement of that pulse 15c is ORed with the other inputs. That is, the OR circuit 21a is triggered if that pulse 15c is logically false, i.e. remains in standby, during the pulse on the input timing signal. A sampled input 15a does not have to be pulsed, since it may be a static input 15d which is valid during the pulse on the input timing signal. The phase of a sampled input 15a, whether pulsed or static, may be inverted from true to complement or vice versa by inverting its voltage level at the input to the strobed OR circuit 21a. For example, if a static input 15d is active-high, it is included in the OR circuit, and if it is active-low, its complement is included in the OR circuit.

The generator (not shown) for the input timing signal 43 is similar to the generator 4 described above for the timing signal 5. The input timing signal 43 may be derived from a timing input 9, or by ORing the true 8t and complement 8c phases of a dual-rail pulsed logic input 8. Exact setup and hold times relative to the triggering inputs depend on the width of the OR circuit 21a and the tuning of the input buffers 1 and input timing signal generator 44. Given that timing requirements are met for the strobed OR circuit 21a, the logic timing signal 5 may be triggered by the input timing signal 43. Any uncertainties in input timing are compensated for in the strobed OR circuit 21a. Since both the OR node 24a and the timing signal 5 are triggered by the input timing signal 9, the timing margin for the strobed inverter 22 may be set tightly, minimizing delay without compromising reliability.

Strobed AND-OR Gate

Figure 7:
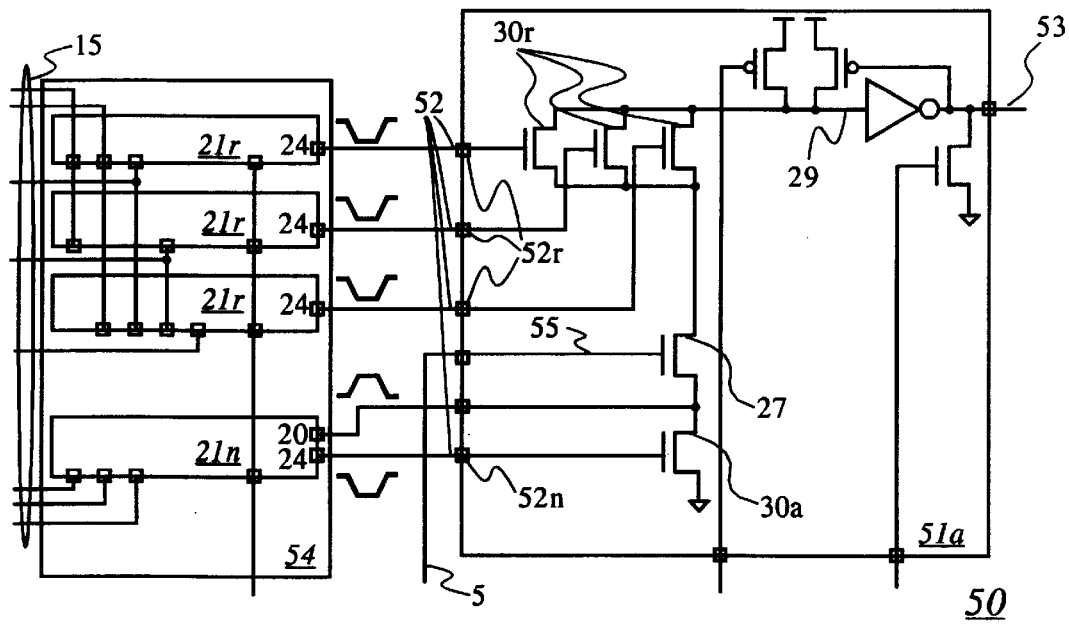
FIG. 7 is a schematic drawing of the structure of a strobed logic gate with an AND-OR logic function.

The inversion provided by the strobed inverter 22 in FIG. 1 contributes to the overall logic power of the SLAM. To maximize SLAM potential logic power, however, as much logic function as possible should be available at each stage. The logic 50 in FIG. 7 is a modification of the NOR gate 2, in which the strobed inverter 22 is replaced with a strobed AND-OR gate 51. This strobed gate 51 retains the benefits of the strobed inverter 22, while making a greater direct contribution to the logic function of a SLAM. In the illustrative embodiment shown in FIG. 7, the logic 50 implements a NOR-AND-OR function.

The strobed gate 51 receives two or more pulsed input signals: a logic timing signal 5 and one or more data signals 52. The strobed gate 51 operates in a fashion similar to that of the strobed inverter 22. If the data inputs 52 are active low and are valid during the occurrence of the timing pulse 5, their values are sampled by the timing pulse 5, and the output 53 of the strobed gate 51 is equivalent to the AND-OR of the complement of the inputs 52. The strobed gate 51a shown in FIG. 7 performs the logical AND of the complement of one of its data inputs, i.e. the "AND" input 52n, and the logical OR of the complement of its four other data inputs 52r, i.e. the "OR" inputs. Other logic functions are possible, as shown in FIGS. 8A-8B, since there may be more or fewer OR inputs 52r, and the AND input 52n is optional. The strobed gate 51b shown in FIG. 8A performs the logical AND of the complement of its AND input 52n and the complement of its OR input 52r. The strobed gate 51c shown in FIG. 8B performs the logical OR of the complement of its three OR inputs 52r. The strobed inverter 22 may be considered a special case of the strobed gate 51, with no AND input and only one OR input 24.

The logic 50 in FIG. 7 also differs from the NOR gate 2 in that there is now an array 54 of several OR circuits 21, each connected to one of the data inputs 52 of the strobed gate. The logic function performed by the OR circuits 21 and the strobed gate 51a is therefore NOR-AND-OR. As discussed above, if the inputs 15 to the OR are inverted, either in the SLAM or before the inputs 1 of a SLAM, the NOR gate 2 is configured to operate as an AND gate. If the logical inputs 15 in FIG. 7 are inverted, the function at the output 53 of the strobed gate 52 is then an AND-AND-OR, which may implement a general AND-OR function subject to the maximal number of inputs of the OR circuits 21 and strobed AND-OR gate 51.

Rules for maximum fan-in of the strobed gate 51 and OR circuits 21 driving it, and for timing of the logic timing signal 5, are based on small simulations of strobed AND-OR gates 51 of different configurations.

An AND-OR function may be implemented using only OR gates 21 and a strobed gate, such as the gate 51c, with solely OR inputs 52r. The AND input 52n to the strobed gate 51 may be used, however, if there is a common term present in each of the OR gates 21. The common term may be removed from the OR gates 21r and placed in a separate OR gate 21n connected to the AND input 52n of the strobed gate 52. There are tradeoffs in factoring the AND-OR in this manner; for example, factoring adds a row to the array 54 of OR circuits 21, but reduces the fan-out, and therefore the loading, size, and power dissipation, of the input buffers 1.

In addition, while the AND device 30n in the strobed gate 52 makes it slower, the reduced fan-in of the OR circuits 21r connected to the OR inputs 52r of the strobed gate makes them faster. The faster OR circuits 21r lead to more margin for the logic timing signal 5, so some delay could be recovered by making the timing signal 5 earlier. In some cases, factoring may actually be necessary to keep the fan-in of the OR circuits 21 within acceptable limits.

This illustrates how the strobed gate may add logic power by increasing the fan-in as well as the depth of the implemented logic. For example, FIG. 9 shows how two OR circuits 21r,21n and a small strobed gate 51b may implement a wide AND with approximately twice the fan-in available with one OR circuit 21 and a strobed inverter 22.

Factoring of one additional input 8 is possible, if the logic timing signal 5t is triggered by that input 8, and so is active only when that input is true. In that case the strobed gate 51 may perform as a three-way AND of that input 8, the complement of the AND input 52n of the strobed gate, and the OR of the complement of its OR inputs 52r. In this case, the reset signal generator 6 must still be triggered every cycle. The trigger 11 may come from a second timing signal 5d, which combines the true 8t and complement 8c phases of the input 8 used for the first timing signal 5t.

Figure 10:
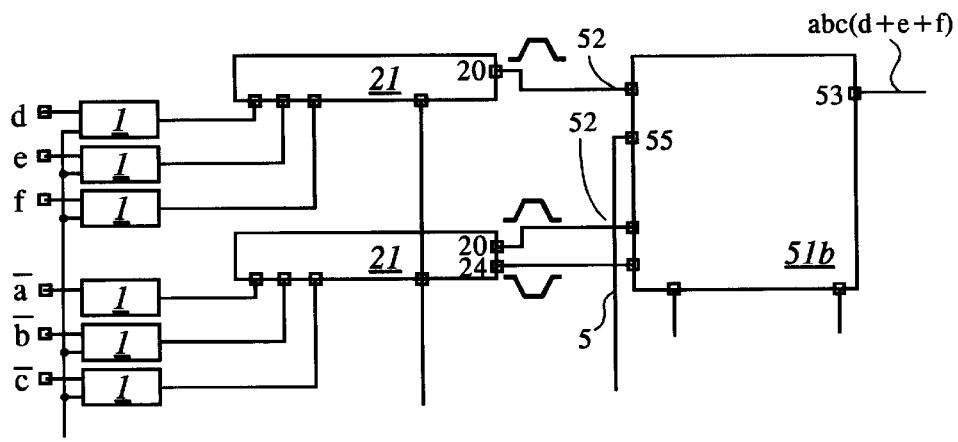
FIG. 10 is a schematic drawing of an efficient implementation of a "diagonal" logic function.

An additional degree of logic flexibility is illustrated by the embodiment in FIG. 10. This embodiment implements the logic function:

A B C D +

A B C +

A B C +

A B C = (A B C) (D + E + F + G)

Here the active level of one of the OR circuits 21 has been inverted by connecting its active-high output 20, i.e. not the usual active-low output 24, to the OR input 52r of the strobed logic gate 51. As a result of this level inversion, the logic performed by the strobed logic gate 51 involves the OR input 52r directly, without being complemented. Logic with the "diagonal" structure of this example may therefore be implemented with no more delay than two-level AND-OR logic, but more efficiently, with a single load on each input buffer 1.

Multiple Strobed Gates

Figure 11:
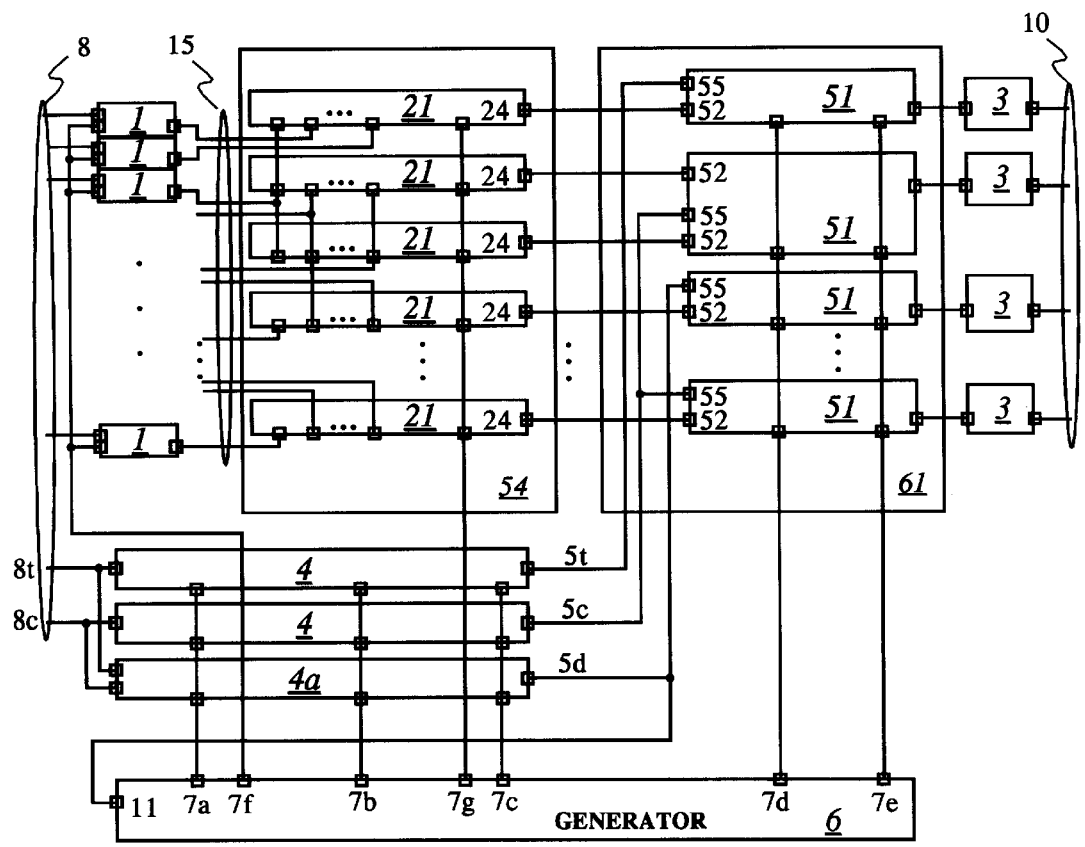
FIG. 11 is a schematic drawing of the structure of a SLAM with multiple outputs.

The SLAM embodiments described above were limited in size to allow a clear focus on the function of each component. The embodiment shown in FIG. 11 illustrates one important way by which to scale up the logic function of a SLAM. The circuit shown in FIG. 11 includes multiple strobed logic gates 51 arranged in a column 61, next to an array 54 of OR circuits 21. Each strobed logic gate 51 drives one of the data outputs 10 of the SLAM through an output buffer 3. The AND and OR inputs 52 of the strobed logic gates 51 are connected one-to-one to the outputs 24 of the OR circuits 21. As shown, the OR circuits 21 may share inputs 15, and each input buffer 1 may drive more than one OR circuit 21. The strobed logic gates 51 are reset together by reset signals 7d,7e. The alternative embodiments of the strobed logic gates 51a–51c shown in FIG. 7 and FIGS. 8A-8B may be used in any combination, such as a mix of logic functions, as shown in FIG. 11, or all the same. In the embodiment shown, all data inputs 8 to the SLAM are available in the desired phase. If this were not the case, the OR gates 21 may be replaced with strobed OR gates 21a, described above, to logically invert some inputs 15 and produce the desired logic functions regardless of the input phases.

In the illustrative embodiment, three logic timing signals 5t,5c,5d are shown, which are derived from one of the SLAM data inputs 8; i.e., the "true" timing signal 5t from the true phase 8t of the data input, the "complement" timing signal 5c from the complement 8c of the input, and the "don't-care" phase 5d from the ORing of the true 8t and complement 8c. Each timing signal input 55 of the strobed logic gate is connected to one of the three timing signals 5t,5c,5d. If a logic function of a strobed logic gate requires the selected data input 8t,8c to be true or false, that strobed logic gate may use the true or false timing signal 5t or 5c, and its associated OR circuits 21 do not need any connections to that data input 8t,8c.

If a function of a strobed logic gate does not require a single value for the selected data input 8t,8c, its timing input is connected to the "don't-care" timing signal 5d, and its dependence on the selected data input 8t,8c, if any, must be through its associated OR circuits 21. Selecting one of the data inputs 8 to generate timing signals 5t,5c,5d may reduce the input capacitance seen by that input 8, because the path 4, 4a for the timing signals 5 has more gain than that for inputs 15 to the OR circuits 21. Selecting one data input 8t,8c to generate the timing signals 5t,5c,5d may also remove many devices from the array 54 of OR circuits 21, if that input 8t,8c is involved in the logic for many of the outputs 10 of the SLAM. One way to select an input 8 to use for timing is to design the SLAM as if all the strobed logic gates 51 derived their timing inputs 55 from a pure timing signal 5 and to determine the data input 8 with the greatest fan-out.

If the logic timing signal 5 is to be a pure timing signal, it is to be derived from ORing the true and complement phases 8t,8c of a data input, or from a timing input 12 to the SLAM.

The number of strobed logic gates 51 and OR circuits 21 is limited by the technology used to implement them and the desired performance of the SLAM. To predict the delay tracking of all the OR circuits 21 and the logic timing signal generator 5, one must consider the across-chip variation in process parameters over the dimensions of the SLAM, and the tracking of power-supply voltages across the SLAM. Also, the synchronization of the outputs 10 of the SLAM and maintenance of timing margins of the strobed logic gates 51 depends on avoiding significant RC delays on internal SLAM wiring. Within these constraints, it is still feasible to construct SLAMs with over 100 strobed logic gates 51 and over 100 OR circuits 21.

Second OR Array

The SLAM embodiment discussed above and illustrated in FIG. 11 may directly implement multiple AND-OR logic functions for sum-of-products logic functions. As described, the features of the illustrative embodiment implement logic with more power using, for example, more levels than typical PLA-style AND-OR logic, which is known to have at least two significant limitations; i.e. its OR width is limited by the number of OR inputs 52r to the strobed logic gate 51, and AND terms must be duplicated if used in multiple outputs. A SLAM embodiment without such limitations is shown in FIG. 12, with an array 71 of second pulsed OR circuits 72 inserted between the column 61 of strobed logic gates and the output buffers 3.

The second OR circuits 72 have the same construction as the OR circuits 21. Each strobed logic gate output 53 drives one or more of the second OR circuits 72, as each input buffer 1 drives one or more OR circuits 21 in the array 54. Each OR circuit 72 drives one output buffer 3. The OR circuits 72 have significantly greater fan-in than the OR of the strobed logic gate 51. In this embodiment, a product term, or AND term, which contributes to multiple outputs may be evaluated once by a strobed logic gate 51 which drives second OR circuits 72 for those outputs. Manual or automatic logic synthesis may be used to find more complicated terms that are common to multiple outputs, taking advantage of the logic power available in the first OR array 54 and strobed logic gates 51.

All of the first OR circuits 21 use devices with the same dimensions and layout, and all of the second OR circuits 72 use devices with the same dimensions and layout. The relative sizes of the devices used in the two arrays 54,71 determine the allowed fan-out from a single strobed logic gate 51. Conversely, the maximum fan-out from any strobed logic gate 51 constrains the relative device sizes in the arrays 54,71. The maximum fan-out may be adjusted during synthesis by replicating logic.

Figure 12:
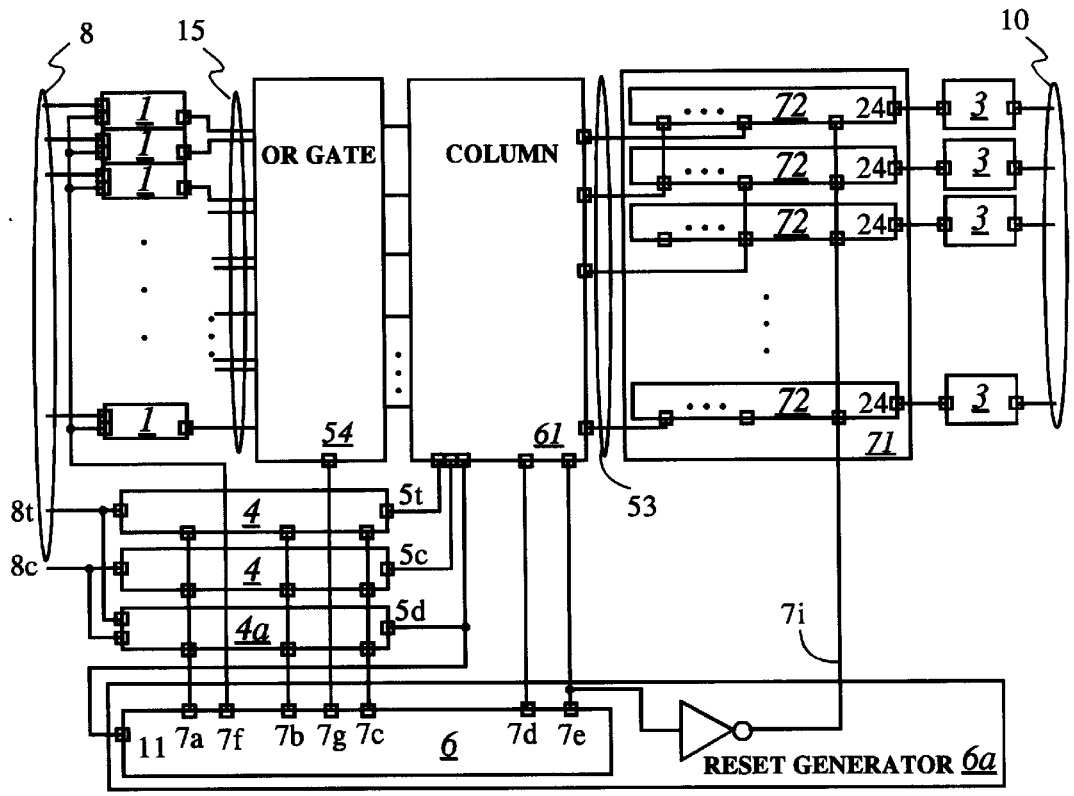
FIG. 12 is a schematic drawing of the structure of a SLAM with multiple outputs and a second OR array.

As shown in FIG. 12, the reset signal generator 6a must produce an additional reset output 7i to reset the second OR circuits 72. This reset signal 7i is simply delayed one stage from the reset signal 7e for the outputs 53 of the strobed logic gates 51.

Figure 13:
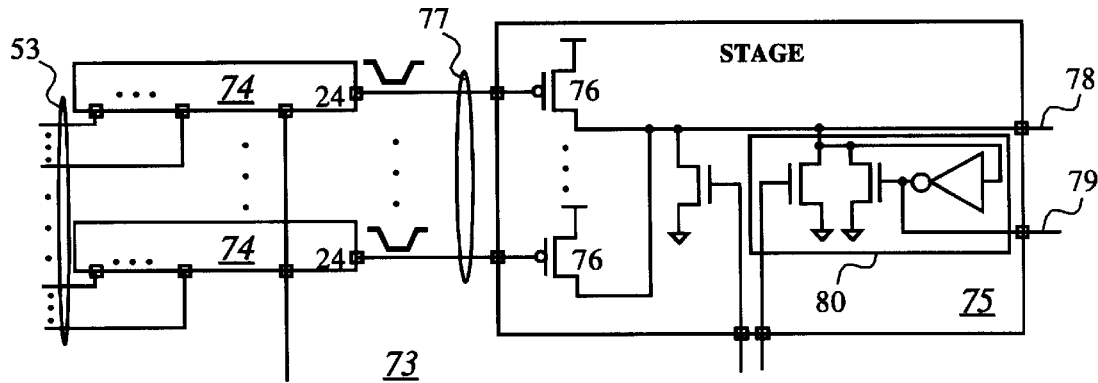

The embodiment shown in FIG. 13 has an even wider OR function than the embodiment in FIG. 12. This wider OR function may provide OR logic with a fan-in of over 100 following the first OR array 54 and strobed logic gates 51.

The embodiment in FIG. 13 achieves this wide fan-in ein the OR array 71 with a two-stage dynamic OR circuit 73. The first stage 74 of the OR circuit 73 has the same construction as the OR gates 21, with NFETs 23 for the OR function, active-high inputs 15 and an active-low output 24. The second stage 75 is complementary to the first stage 74, with PFETs 76 for the OR function, active-low inputs 77 and an active-high output 78. Babysitting circuitry 80, complementary to the babysitting circuits 16 in the first stage 74, may provide an active-low output 79 when needed. The two-stage circuit 73 has one NFET OR circuit 74 for each input 77 of the second stage 75.

Output Inversion

The various embodiments in FIG. 14 of strobed output buffers illustrate a third means for introducing a logical inversion into the logic function of a SLAM. FIG. 14A shows a generic strobed output buffer 81. Such strobed output buffers 81 may be configured to be of two types; i.e. one embodiment 81$t$ illustrated in FIG. 14B provides a true or identical output 10$t$, and a second embodiment 81$c$ illustrated in FIG. 14C provides a complement output 10$c$. The strobed output buffers may be configured to be a dual-rail buffer 81$d$, such as shown in FIG. 14D, which uses both types 81$t$, 81$c$ together.

The strobed output buffer 81 of FIG. 14A has a timing input 82, connected to an output timing signal 83 which occurs every cycle, and a data input 84. The data input 84 may be connected either to the output 53 of the strobed logic gates 51, or to the second array 71 of OR circuits 21 if one is present. The output buffers 81 are the same in either case, as described below.

The true 81$t$ and complement 81$c$ buffers of FIGS. 14A-14B, respectively, have the same construction, which is the same as that of the strobed inverter 22. The type of buffer is determined by the active level of the data input 84. An active-low data input 84$c$ is used for an inverting buffer 81$c$, and the input 84$c$ must be valid during the pulse on the timing input 82. An active-high data input 84$t$ makes a non-inverting buffer 81$t$, and the input 81$t$ must overlap the pulse on the timing input 82. The timing of the output timing signal 83 to meet this requirement depends on whether the OR array 71 is present, and is described below for both cases.

If the output buffers 81 follow an array 71 of second OR circuits 72, active-low 24 and active-high 20 outputs are available from the OR circuits for complement and true SLAM outputs, respectively. Similarly, if the output buffers 81 follow two-stage OR circuits 73, the active-low 79 and active-high 78 outputs of the OR circuits 73 are used for complement and true SLAM outputs, respectively.

While strobing is not necessary in a non-inverting buffer, using a strobed buffer in both inverting and non-inverting cases helps simplify the output timing of the SLAM. When all outputs come from strobed output buffers 81 which are strobed by a single output timing signal 83, then all outputs have the same timing, and that timing is independent of data history, data pattern, and output phase.

Output Timing Signal

As mentioned above, the data inputs 84 to the strobed output buffers 81 should be valid during the pulse on the output timing signal 83. The output timing signal 83 should therefore be generated to be slightly later than the latest of the data inputs 84 of the output buffer, and should be reset before the data inputs 84 of the output buffer are reset.

The embodiment illustrated in FIG. 15 includes strobed output buffers 81 whose data inputs 84 come directly from the strobed logic gates 51, and an output timing signal generator 91. The output timing signal generator 83 is triggered by a logic timing signal 5$d$ which pulses every cycle, in which, if there is more than one logic timing signal 5$t$,5$c$,5$d$, there is always one signal 5$d$ which carries only timing information; i.e. is active every cycle. For good delay tracking, the first stage 92 of the output timing signal generator 91 has the same construction as the strobed logic gates 51. The strobed logic gate 51 used for the first stage 92 has its data inputs 52 tied high, and its timing input 55 connected to the triggering logic timing signal 5$d$. Logically, then, the first stage 92 is a buffer for the logic timing signal 5$d$. The AND and OR fan-in of the first stage 92, and hence its delay, are chosen to match that of the slowest of the strobed logic gates 51. Generally, the slowest gate is the one with the greatest fan-in.

Later stages 93 of the output timing signal generator 91 are sized according to the load presented by the output buffers 81, to make the delay from the output of the first stage 92 to the output timing signal 83 a predetermined value. Because the delay of the first stage 92 matches that of the slowest of the strobed logic gates 51, the setup time between any data input 84 to an output buffer 81 and the output timing signal 83 is at least this predetermined value to which the delay is tuned. Because both data 84 and timing 82 inputs to the output buffers 81 may be traced back to a logic timing signal 5$t$, 5$c$, or 5$d$, the setup time at the output buffers 81 does not depend on the timing of the SLAM inputs 8, and does not influence the input timing requirements of the SLAM.

In a manner similar to the strobed logic gates 51, the strobed output buffers 81 work correctly with slightly negative setup time. The safety margin for correct operation is therefore at least equal to the delay of the later stages 93 of the output timing signal generator 91. Because the paths from the data 84 and timing 83 inputs back to a common signal 5$d$ are a few stages, this target delay may be kept small.

Figure 16:
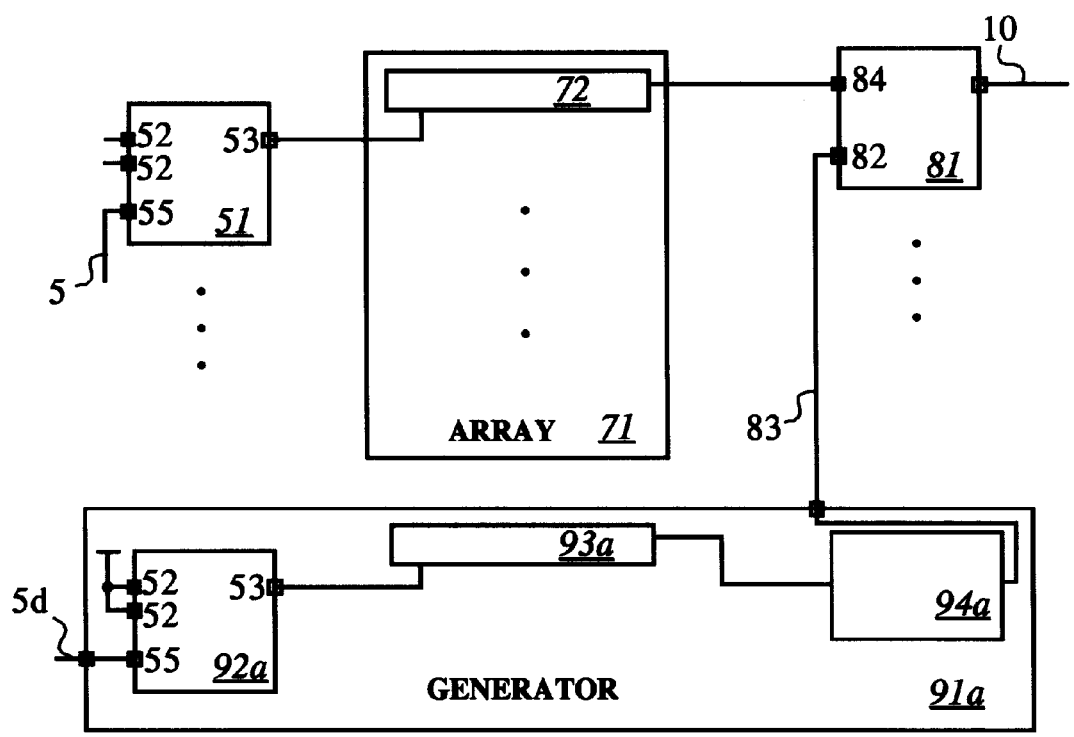
FIG. 16 is a schematic drawing of the structure of an output timing signal generator for use with strobed output buffers following an array of second OR circuits.

FIG. 16 shows an embodiment of an output timing signal generator 91$a$ in which there is an array 71 of second OR circuits 72 between the strobed logic gates 51 and the strobed output buffers 81. As in FIG. 15, the output timing signal generator 91$a$ is triggered by a logic timing signal 5$d$ which occurs every cycle. Also, the first stage 92$a$ of the output timing signal generator 91$a$ has the same construction as the slowest of the strobed logic gates 51. The second delay stage 93$a$ of the output timing signal generator 91$a$ has the same construction as an OR circuit 21. As in the logic timing signal generator 4 and the first array 54 of OR circuits 21, the devices 15 of this stage 93$a$ have the same layout and orientation as those in the second OR circuits 72, and is physically located adjacent to the array 71. All of the inputs of the OR circuit 93$a$ are tied together, so logically the second stage 93$a$ is a buffer.

Sizing of the stages 92$a$, 93$a$, 94$a$ of the output timing signal generator 91$a$ is done to achieve a predetermined timing margin at the inputs 83, 84 to the output buffers 81. By taking into account the OR and AND fan-ins of the strobed logic gates 51, the wire and gate loading on them, and the fan-ins of the second OR circuits 72, one first predicts the worst delay from a logic timing signal 5$t$,5$c$,5$d$ to the data inputs of the strobed output buffers 84. As noted above, the first stage 92$a$ of the output timing signal generator 91$a$ tracks the delay of the slowest of the strobed logic gates 51.

The target delays through the later stages are chosen so that the output timing signal 82 is later than the latest data signal 84 by the desired margin. This margin may be safely set to about one inverter delay, since the paths from the logic timing signals 5 to the data 84 and timing 83 inputs of the output buffers 81 re-converge after only a few stages. The final stage 94a of the output timing signal generator 91a is sized, based on its target delay and the wire and gate load presented by the output buffers 81, by setting the widths of its devices. The OR circuit 93a is sized by choosing its number of inputs.

While the disclosed SLAMs has been particularly shown and described with reference to the preferred embodiments, it is understood by those skilled in the art that various modifications in form and detail may be made therein without departing from the scope and spirit of the invention. Accordingly, modifications such as those suggested above, but not limited thereto, are to be considered within the scope of the invention.

What is claimed is:

1. A logic circuit, comprising:
    a plurality of inputs to which a plurality of data input signals can be applied;
    a plurality of input buffers coupled to receive the input signals from the inputs;
    a NOR circuit coupled to receive the outputs of the input buffers and a pulsed logic timing signal synchronized within a predefined window with the arrival of the data input signals;
    an output buffer coupled to receive the output of the NOR circuit; and
    an output at which a data output signal is produced, the output signal being a logical NOR of the data input signals;
    wherein each of the NOR circuit, the plurality of input buffers and the output buffer having a separate reset input to reset it to a standby state.

2. The logic circuit of claim 1, wherein the NOR circuit comprises a pulsed OR circuit coupled to receive the output of the input buffers, and a strobed inverter taking as input the output of the OR circuit and the synchronized logic timing signal.

3. The logic circuit of claim 2, wherein the pulsed OR circuit is reset after the logic timing signal is reset.

4. The logic circuit of claim 2, wherein the data input signals are pulsed signals.

5. The logic circuit of claim 4, wherein the input buffers are set-reset latches which are set by the data input signals and reset by a common reset signal.

6. The logic circuit of claim 4, wherein the pulsed OR circuit is reset after the input buffers are reset.

7. The logic circuit of claim 2, wherein:
    the OR circuit is a strobed OR circuit taking as input the output of the input buffers and a pulsed input timing signal synchronized within a predetermined timing window with the arrival of the data input signals;
    the input timing signal occurs every cycle;
    the output of the input buffers are valid during the occurrence of the input timing signal; and
    the strobed OR circuit produces a pulsed output which is equivalent to the logical OR of the data input signals.

8. The logic circuit of claim 7, wherein the strobed OR circuit comprises means for receiving active high data inputs and an active high input timing pulse; and
    wherein the data inputs may be either pulsed or static.

9. The logic circuit of claim 8, wherein any of the logical inputs to the OR can be inverted by inverting the active level of the corresponding data input from high to low.

10. The logic circuit of claim 2, wherein the strobed inverter comprises means for receiving an active low data pulse and an active high timing pulse and generating an output data pulse, the output being the logical inverse of the input data pulse; and
    wherein the input data pulse is valid during the occurrence of the timing pulse.

11. The logic circuit of claim 2, further comprising:
    a reset signal generator for generating each of the reset signals, the reset signal generator having a reset trigger input; and
    wherein the trigger input of the reset signal generator is present every operating cycle.

12. The logic circuit of claim 11, wherein the trigger input of the reset signal generator is the synchronized logic timing signal.

13. The logic circuit of claim 12, wherein the reset signal generator comprises a plurality of delay stages each producing a separate reset output to be used as one of the separate reset inputs.

14. The logic circuit of claim 2, further comprising a logic timing signal generator for generating the logic timing signal, the timing signal generator receiving the true and complement of one of the pulsed data inputs as its input signals.

15. The logic circuit of claim 14, wherein the logic timing signal is the logical OR of the true and complement of the pulsed data inputs.

16. The logic circuit of claim 15, wherein one of the delay stages is an OR gate having a number of inputs depending upon the desired drive of the OR gate, the true input signals being tied to one or more of the inputs of the OR gate and the complement input signals being tied to the remaining OR gate inputs.

17. The logic circuit of claim 2, further comprising a logic timing signal generator for generating the logic timing signal, the timing signal generator being coupled to receive a non-global timing input.

18. The logic circuit of claim 17, wherein the logic timing signal generator comprises a plurality of delay stages.

19. The logic circuit of claim 18, wherein the final delay stage is sized to drive the total load on the synchronized logic timing signal.

20. The logic circuit of claim 18, wherein one of the delay stages is an OR gate having a number of inputs depending upon a desired drive of that OR gate, all of the inputs of the OR gate being provided by the output of a previous delay stage.

21. The logic circuit of claim 20, wherein the OR gate of the logic timing signal generator is substantially identical structurally to an OR circuit having the same number of inputs.

22. The logic circuit of claim 2, wherein the strobed inverter is a strobed logic gate including means for performing an OR-AND of the logical inverse of its inputs, each input coming from the output of a different OR circuit.

23. The logic circuit of claim 22, wherein the logic timing signal is equivalent to one of the pulsed data input signals, and the logic performed by the strobed logic gate is the AND of that pulsed data input signal and the OR-AND of the inverse of the outputs of the OR gates.

24. The logic circuit of claim 22, wherein the strobed logic gate further comprises means for receiving active low data pulses and an active high timing pulse and generating an OR-AND of the logical inverse of the data pulses, wherein the input data pulses are valid during the occurrence of the timing pulse.

25. The logic circuit of claim 24, wherein the inversion of any of the inputs of the strobed logic gate can be optionally removed by inverting the active level of the data pulse from low to high.

26. A logic array, comprising:

a plurality of logic circuits including:

a plurality of inputs to which a plurality, of data input signals can be applied;

a plurality of input buffers coupled to receive the input signals from the inputs;

a NOR circuit coupled to receive the outputs of the input buffers and a pulsed logic timing signal synchronized within a predefined window with the arrival of the data input signals, the NOR circuit having:

a pulsed OR circuit coupled to receive the output of the input buffers; and a strobed inverter taking as input the output of the OR circuit and the synchronized logic timing signal;

an output buffer coupled to receive the output of the NOR circuit; and an output at which a data output signal is produced, the output signal being a logical NOR of the data input signals; and a logic timing signal generator for generating the logic timing signal, the timing signal generator receiving the true and complement of one of the pulsed data inputs as its inprit signals, wherein the logic timing signal is the logical OR of the true and complement of the pulsed data inputs;

wherein each of the NOR circuit, the plurality of input buffers and the output buffer having a separate reset input to reset it to a standby state; and wherein each of the inputs can be shared among a plurality of the OR gates, the reset signals for like components being the same.

27. The logic array of claim 26, wherein the output buffers include means for producing true and/or complement outputs.

28. The logic array of claim 27, wherein each output buffer is a strobed buffer which takes as input the output of one of the strobed logic circuits and an output timing signal, and produces pulsed or static outputs which are one or both of a true and complement of the output of the strobed logic circuit; and wherein the output timing signal is synchronized within a predefined window with the output of the strobed logic circuits.

29. The logic array of claim 28, wherein the reset for the output timing signal occurs earlier than the reset of the strobed logic circuits.

30. The logic array of claim 28, further comprising an output timing signal generator for generating the output timing signal, the output timing signal generator being triggered by a logic timing signal which occurs on every cycle.

31. The logic array of claim 30, wherein the output timing signal generator comprises a plurality of delay stages.

32. The logic array of claim 31, wherein the final delay stage of the output signal generator is sized to drive a desired number of strobed output buffers.

33. The logic array of claim 31, wherein a first delay stage of the output timing signal generator is substantially identical to a slowest of the strobed logic gates.

34. The logic array of claim 26, further comprising:

an array of pulsed OR circuits;

wherein the output of each strobed logic circuit is coupled to one or more of the array of pulsed OR circuits; and wherein the output of each pulsed OR circuit is coupled to one of the output buffers.

35. The logic array of claim 34, wherein each of the pulsed OR circuits comprises:

a first pulsed OR stage coupled to receive active-high pulses from the strobed logic circuits and producing active-low pulsed outputs; and a second pulsed OR stage coupled to receive active-low pulses from one or more first OR stages, and producing active-high pulsed outputs;

wherein the output buffers are coupled to receive the active-high pulsed outputs from the pulsed OR circuits.

36. The logic array of claim 34, wherein the output buffers are strobed buffers each of which takes as input the output of one of the pulsed OR circuits and an output timing signal, and produces pulsed or static outputs which are one or both of a true and complement of the output of the pulsed OR circuit;

wherein the output timing signal is synchronized within a predefined window with the output of the OR circuit;

wherein the output timing signal is produced by an output timing signal generator triggered by a logic timing signal which occurs on every cycle; and wherein the output timing signal generator comprises a plurality of delay stages.

37. The logic array of claim 36, wherein a delay stage of the output timing signal generator is an OR gate having a number of inputs depending upon a desired drive of that OR circuit, all of the inputs being taken from the outputs of a previous delay stage.

38. The logic array of claim 37, wherein an OR gate in the output timing signal generator is substantially identical to an OR gate in the second array having the same number of inputs.

* * * * *